(12) United States Patent
Jeong et al.

(10) Patent No.: US 11,769,630 B2
(45) Date of Patent: Sep. 26, 2023

(54) DIELECTRIC MATERIAL, METHOD OF PREPARING THE SAME, AND DEVICE COMPRISING THE SAME

(71) Applicant: Samsung Electronics Co., Ltd., Suwon-si (KR)

(72) Inventors: Taewon Jeong, Yongin-si (KR); Hyeon Cheol Park, Hwaseong-si (KR); Daejin Yang, Seoul (KR); Doh Won Jung, Seoul (KR); Giyoung Jo, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 409 days.

(21) Appl. No.: 17/165,300

(22) Filed: Feb. 2, 2021

(65) Prior Publication Data
US 2022/0028613 A1 Jan. 27, 2022

(30) Foreign Application Priority Data

Jul. 21, 2020 (KR) .................. 10-2020-0090571

(51) Int. Cl.
| | | |
|---|---|---|
| *H01G 4/12* | (2006.01) | |
| *C04B 35/497* | (2006.01) | |
| *G11C 11/22* | (2006.01) | |
| *H01L 49/02* | (2006.01) | |
| *H10B 53/00* | (2023.01) | |

(52) U.S. Cl.
CPC ......... *H01G 4/1254* (2013.01); *C04B 35/497* (2013.01); *G11C 11/221* (2013.01); *H01L 28/60* (2013.01); *H10B 53/00* (2023.02)

(58) Field of Classification Search
None
See application file for complete search history.

(56) References Cited

U.S. PATENT DOCUMENTS

| | | | |
|---|---|---|---|
| 10,262,796 B2* | 4/2019 | Takahashi | ............ H01G 4/1272 |
| 2008/0239627 A1* | 10/2008 | Bridger | .................. H01C 7/115 |
| | | | 361/321.5 |
| 2010/0085681 A1* | 4/2010 | Takeda | ................ C04B 35/4682 |
| | | | 361/301.4 |
| 2013/0320815 A1* | 12/2013 | Hatano | .............. H03H 9/02543 |
| | | | 310/365 |
| 2018/0040424 A1* | 2/2018 | Takahashi | ............... C04B 35/64 |

(Continued)

FOREIGN PATENT DOCUMENTS

| | | |
|---|---|---|
| CN | 102249678 A | 11/2011 |
| CN | 102320828 A | 1/2012 |
| KR | 10-2022-0003362 A | 1/2022 |

OTHER PUBLICATIONS

Du et al. "Effects of CaAl2O4 on the electrical properties and temperature stability of (Na0.53K0.404Li0.066)Nb0.92Sb0.08O3 ceramics", Journal of Alloys and Compounds (2012), 541, 454-457.

*Primary Examiner* — Dion R. Ferguson
(74) *Attorney, Agent, or Firm* — HARNESS, DICKEY & PIERCE, P.L.C.

(57) ABSTRACT

Provided are a dielectric material including a compound represented by Formula 1, a device including the same, and a method of preparing the dielectric material:

$$(1-x)K_aNa_bNbO_3 \cdot xM(A_cSb_d)O_3 \quad \text{[Formula 1]}$$

wherein, in Formula 1, M is a Group 2 element, A is a trivalent element, and $0<x<1$, $0<a<1$, $0<b<1$, $0<c<1$, $0<d<1$, $a+b=1$, and $c+d=1$.

39 Claims, 10 Drawing Sheets

(56) References Cited

U.S. PATENT DOCUMENTS

2022/0005647 A1   1/2022  Jo et al.
2022/0028613 A1*  1/2022  Jeong .................... H01G 4/1254
2022/0123102 A1*  4/2022  Jo ............................ H01G 4/30
2022/0415577 A1*  12/2022  Jeong .................... H01G 4/1218

* cited by examiner

DIELECTRIC MATERIAL, METHOD OF PREPARING THE SAME, AND DEVICE COMPRISING THE SAME

CROSS-REFERENCE TO RELATED APPLICATION

This application is based on and claims priority under 35 U.S.C. § 119 to Korean Patent Application No. 10-2020-0090571, filed on Jul. 21, 2020, in the Korean Intellectual Property Office, the disclosure of which is incorporated by reference herein in its entirety.

BACKGROUND

1. Field

The present disclosure relates to dielectric materials, preparation methods thereof, and devices including the same.

2. Description of Related Art

In accordance with the continuing demand for miniaturization and higher capacity of electronic products, capacitors having a smaller size and higher capacity compared to capacitors of the related art are required. In order to implement capacitors having a smaller size and higher capacity, there is a need for dielectric materials that can provide further improved dielectric properties.

To manufacture a multi-layered ceramic capacitor (MLCC), which is a type of small-size, high-capacity capacitor, dielectric material layers need to be made thin. This inevitably induces a rapid increase in magnitude of the electric field of the device, which may lead to a reduction in spontaneous polarization of dielectrics, and consequently a remarkable drop in permittivity. Therefore, the need to replace existing dielectrics with a dielectric material that effectively operates in a high-electric field region is gradually increasing.

SUMMARY

Provided is a dielectric material that has improved structural stability and physical properties and effectively operates in a high-electric field region.

Provided is a device including the dielectric material.

Provided is a method of preparing the dielectric material.

Additional aspects will be set forth in part in the description which follows and, in part, will be apparent from the description, or may be learned by practice of the presented embodiments of the disclosure.

According to an aspect, provided is a dielectric material including a compound represented by Formula 1:

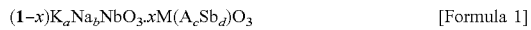  [Formula 1]

wherein, in Formula 1, K is potassium, Na is sodium, Nb is niobium, Sb is antimony, O is oxygen, M is a Group 2 element, A is a trivalent element, and $0<x<1$, $0<a<1$, $0<b<1$, $0<c<1$, $0<d<1$, $a+b=1$, and $c+d=1$.

According to another aspect, provided is a device comprising: a plurality of electrodes; and a dielectric material layer between the plurality of electrodes, wherein the dielectric material layer includes the above-described dielectric material.

The device may be a capacitor.

The device may be a multi-layer capacitor including: a plurality of internal electrodes; and a plurality of dielectric material layer alternately disposed between the plurality of internal electrodes.

According to another aspect, provided is a method of preparing a dielectric material including a compound represented by Formula 1, the method including: mechanically milling a mixture of potassium salt, sodium salt, a Nb compound, an M-containing compound, an A compound, and an Sb compound; and performing first heat treatment under an oxidizing atmosphere, wherein the dielectric material comprises a compound represented by Formula 1:

  [Formula 1]

wherein, in Formula 1, M is a Group 2 element, A is a trivalent element, and $0<x<1$, $0<a<1$, $0<b<1$, $0<c<1$, $0<d<1$, $a+b=1$, and $c+d=1$.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1A:
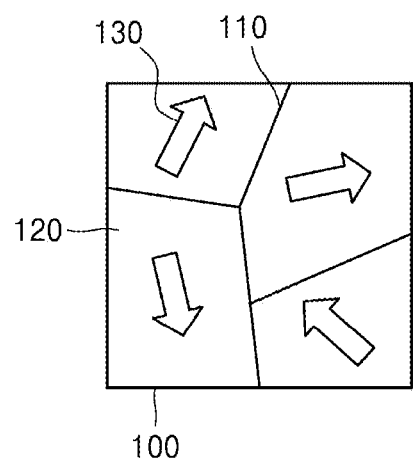
FIGS. 1A to 1C are conceptual diagrams illustrating how, under a high-electric field, permittivity is reduced due to fixed spontaneous polarization in an existing thin-filmed ferroelectric material.

Reference will now be made in detail to some example embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, embodiments of a dielectric material, a device including the same, and a method of preparing the dielectric material will be described in greater detail.

A dielectric material according to an embodiment may include a compound represented by Formula 1:

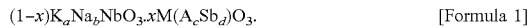

$$(1-x)K_aNa_bNbO_3 \cdot xM(A_cSb_d)O_3. \quad \text{[Formula 1]}$$

wherein in Formula 1, M is a Group 2 element, A is a trivalent element, and 0<x<1, 0<a<1, 0<b<1, 0<c<1, 0<d<1, a+b=1, and c+d=1.

For example, in Formula 1, M may be at least one of Sr, Ca, Ba, and Mg, and A may be at least one of B, Al, Ga, In, TI, Sc, Y, La, Ce, Pr, Nd, Sm, Eu, Gd, Tb, and Dy.

In Formula 1, A may represent one or more elements selected from among the Group 13 elements, and/or the lanthanide elements, and may be, for example, at least one of B, Al, Ga, In, TI, Sc, Y, La, Ce, Pr, Nd, Sm, Eu, Gd, Tb, Dy, Ho, Er, Tm, Yb, and Lu.

In Formula 1, x may be 0.01 to 0.3, for example, 0.05 to 0.2. When x is 0.01 to 0.3, this means that the amount of $M(A_bSb_d)O_3$ in the compound of Formula 1 is 1 mol % to 30 mol %.

To manufacture a multi-layered ceramic capacitor (MLCC), which is a type of small-size, high-capacity capacitor, dielectric material layers need to be formed to have a small thickness. When the dielectric material layer is formed to have a small thickness, it is inevitable that a magnitude of the electric field of the MLCC may be rapidly increased. Thereby, spontaneous polarization of the dielectric material may be reduced, thus leading to a remarkable drop in permittivity of the dielectric material layer. Therefore, there is a need to replace existing ferroelectric materials with ferroelectric materials which resolve the above-described problems and which can effectively operate in a high-electric field region.

In one or more example embodiments, the dielectric material, which is a ferroelectric material satisfying the above-described characteristics, may include a compound of Formula 1. The compound of Formula 1 may be a product of a substitution of a $K_aNa_bNbO_3$ (KNN) dielectric material, which is one of the perovskite compounds having high-dielectric properties, with $M(A_bSb_d)O_3$. The $K_aNa_bNbO_3$ (KNN) dielectric material may be, for example, $(K_{0.5}Na_{0.5})NbO_3$. Here, $M(A_bSb_d)O_3$ and the compound of Formula 1 including the same may each be in the form of a solid solution.

The compound of Formula 1, when in the form of a solid solution, may form a pseudo-cubic structure through the modification of the lattice structure of the solid solution due to a difference in ionic radius between the elements constituting the matrix KNN and $M(A_bSb_d)O_3$. As a result, the phase transition temperature of the matrix KNN may be lowered to near room temperature (25° C.), leading to an increase in permittivity at room temperature. Also, M, such as Sr and $A_cSb_d$, such as BSb, are introduced into the sites of elements constituting KNN to form a defect cluster the M may act as a donor, and the $A_cSb_d$ may act as an acceptor. In the above-described defect cluster, due to an effect of polar nanoregions (PNRs), the dielectric material according to one or more embodiments may have a lowered AC sweep reaction energy barrier even at a high-electric field. As such, when the AC sweep reaction energy barrier is lowered, a phenomenon of polarization fixation may be alleviated, whereby a permittivity reduction rate may be improved.

Hereinafter an operational principle of the dielectric material according to one or more example embodiments will be described.

Figure 1B:
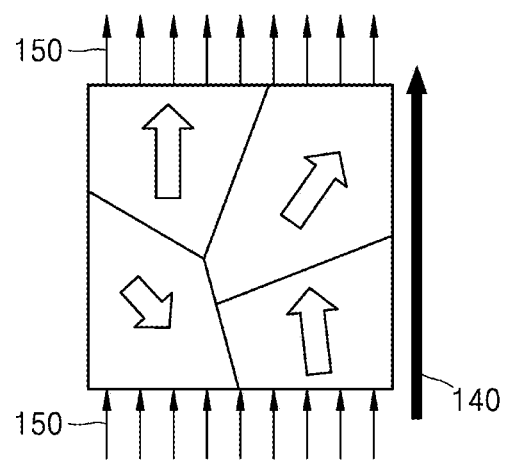
Figure 1C:
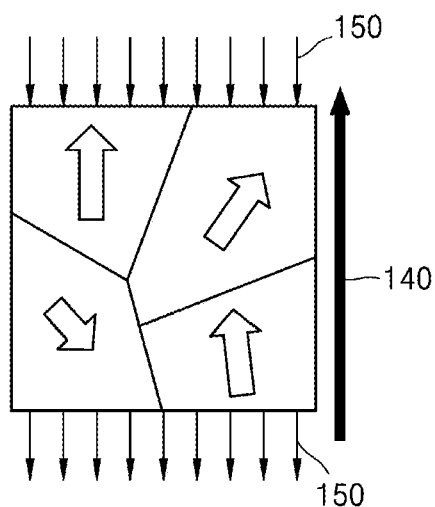

FIGS. 1A to 1C are conceptual diagrams illustrating how, under a high-electric field, permittivity is reduced due to fixed spontaneous polarization in an existing thin-filmed ferroelectric material, for example due to spontaneous polarization being fixed under a high direct current (DC) voltage under a high-electric field.

In FIG. 1A, a ferroelectric material 100, of which the thickness is reduced to several nanometers according to high integration and miniaturization may include KNN, for example, $(K_{0.5}Na_{0.5})NbO_3$. The ferroelectric material 100 may include domains 120 of KNN separated by boundaries 110. Each domain 120 of the ferroelectric material 100 may have a polarization 130. The polarization 130 may be, initially, randomly oriented in each domain 120. For example, when no electric field is applied to the ferroelectric material 100, the polarization 130 of each domain 120 is in an arbitrary direction as shown in FIG. 1A. As a high direct current (DC) voltage (e.g., a DC bias 140) is applied to the ferroelectric material 100, the ferroelectric material 100 is under a high-electric field. Accordingly, the polarization 130 of each domain 120 of the ferroelectric material 100 may mostly align in the same direction as the DC bias 140, such that, as a whole, the ferroelectric material 100 exhibits polarization in the same direction as the DC bias 140. Thereafter, as shown in FIG. 1C, even when the direction of an AC bias 150 changes to the opposite direction to the DC bias 140 while the DC bias 140 is present in the ferroelectric material 100, the direction of the polarization 130 of each domain 120 does not change, and therefore remains in the same direction as the DC bias 140. As such, after the polarization 130 of the ferroelectric material 100 is fixed in the direction of the DC bias 140, the polarization 130 may not respond to the change of the AC bias 150, which rapidly reduce the permittivity of the ferroelectric material 100. As a result, the ferroelectric material 100 may not function as a dielectric material.

Hereinafter, as a way to improve the deterioration of ferroelectric properties (e.g., permittivity reduction) appearing in a ferroelectric material due to high integration and miniaturization, provided is a dielectric material including the compound represented by Formula above, as a novel dielectric material to which a mechanism of effective operation even under a high electric field is applied.

The dielectric material according to one or more embodiments may be a ceramic ferroelectric that exhibits a higher permittivity than that of conventional KNN even in a high-electric field to which a high DC voltage is applied. Such a ferroelectric material may include a portion having a low AC sweeping energy barrier, and due to the portion having a low AC sweeping energy barrier, the ferroelectric material may respond to AC sweeping even under a high electric field and exhibit a higher permittivity than that of conventional KNN. For example, the dielectric properties may be maintained even under a high-electric field.

In one or more example embodiments, the compound of Formula 1 may be a relaxer-ferroelectric material.

Figure 2A:
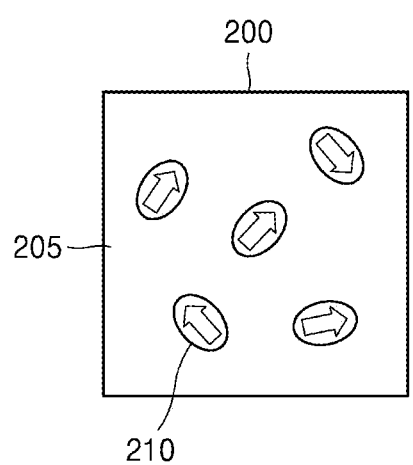
FIGS. 2A to 2C are conceptual diagrams illustrating that a relaxer-ferroelectric material, which is a dielectric material according to an example embodiment, exhibits high permittivity even under a high-electric field, due to polar nanoregions (PNRs) in the relaxer-ferroelectric material.
Figure 2B:
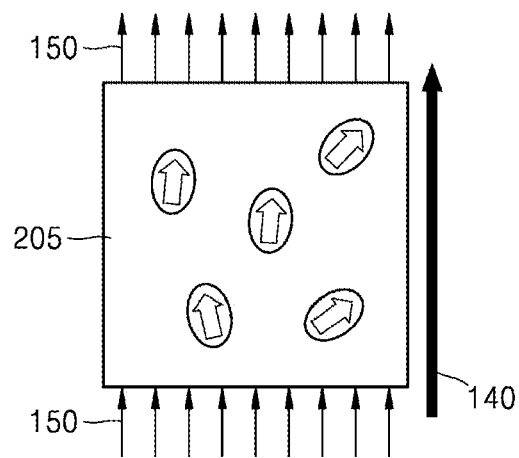
Figure 2C:
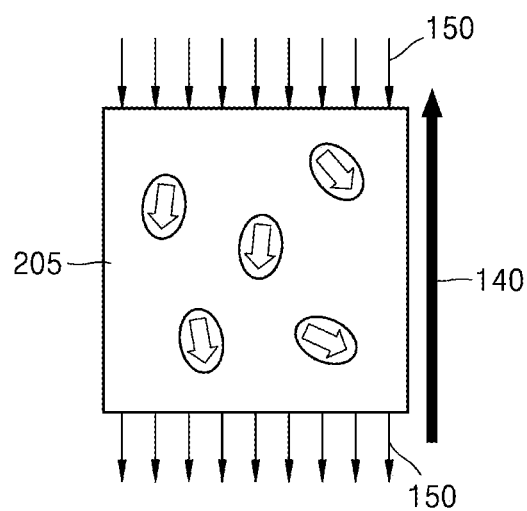

FIGS. 2A to 2C are conceptual diagrams illustrating that a relaxer-ferroelectric material, which is a dielectric material according to an example embodiment, responds well to an AC bias under a high-electric field, for example, a high DC bias, due to polar nanoregions (PNRs) in the dielectric material, and thus exhibits high permittivity.

Referring to FIGS. 2A to 2C, a relaxer-ferroelectric material 200, which is a dielectric material according to an example embodiment, includes a ferroelectric material 205, which exhibits a first polarization characteristic, and a polar region 210, which is included in the ferroelectric material 205 and exhibits a second polarization characteristic. The first polarization characteristic and the second polarization characteristic may be different from each other. The first polarization characteristic and the second polarization characteristic may include spontaneous polarization characteristics. The relaxer-ferroelectric material 200 may be expressed as a relaxer-ferroelectric material layer. The polar region 210 may be expressed as a polar layer and/or a polar portion. The ferroelectric material 205 may be expressed as a ferroelectric material layer. When applied in an electronic device (e.g., a capacitor) the ferroelectric material 205 may have a thickness of 1000 nm or less.

In one or more embodiments, the ferroelectric material 205 may be a dielectric material and/or a dielectric material layer according to an example embodiment. The polar region 210 may include a solid solution including a material different from the ferroelectric material 205. When the ferroelectric material 205 includes the compound of Formula 1, the relaxer-ferroelectric material 200 including the polar region 210 may have a pseudo-cubic crystalline structure as a whole, and which does not exhibit peaks corresponding to (002) and (004) in an X-ray diffraction spectrum.

For example, the polar region 210 may be a partial region of the ferroelectric material 205 in which a main element is substituted with a different element. When the ferroelectric material 205 is KNN, the polar region 210 may be a region formed by a defect cluster in which K in the A-site of KNN is substituted with a first element different from K, and Nb in the B-site of KNN is substituted with a second element different from Nb, which may be a polar nanoregion (PNR).

The first element may be an element acting as a donor, and the second element may be an element acting as an acceptor. The first element and the second element may have different ionic radii. In an example embodiment, the ionic radius of the first element may be greater than the ionic radius of the second element. The amounts of the first element and the second elements included in the relaxer-ferroelectric material 200 may be the same.

The first element may be, for example, a Group 2 element, (e.g., at least one of Sr, Ca, Ba, and Mg). The second element may include, for example, $A_cSb_d$ (wherein A is a trivalent element).

Thus, since the material of the polar region 210 is different from the ferroelectric material 205, the first polarization characteristic of the ferroelectric material 205 may be different from the second polarization characteristic of the polar region 210. Accordingly, in response to the AC sweeping 150, the energy barrier of the ferroelectric material 205 and the energy barrier of the polar region 210 may be different from each other. In an example embodiment, the energy barrier of the polar region 210 in response to the AC sweeping 150 may be lower than that of the ferroelectric material 205. For this reason, as shown in FIGS. 2B and 2C, when the relaxer-ferroelectric material 200 is under a high DC bias 140, the total polarization of the ferroelectric material 205 is fixed in the direction of the DC bias 140 like the ferroelectric material 100 of FIG. 1 due to the high electric field caused by the DC bias 140 and does not respond to the AC bias 150 applied to the relaxer-ferroelectric material 200, but the polar region 210 may directly respond to the AC bias 150, and thus the polarization direction of the polar region 210 may change in response to the AC bias 150. As such, the relaxer-ferroelectric material 200 may exhibit a high permittivity even under a high electric field caused by a high DC voltage.

In the relaxer-ferroelectric material 200 of FIG. 2A to 2C, the ferroelectric material 205 also includes a plurality of domains like the ferroelectric material 100 of FIG. 1A, although not illustrated for convenience. Each domain included in the ferroelectric material 205 may include a plurality of polar regions 210. The polarization characteristics of regions other than the polar region 210 in each domain may be different from that of the polar region 210.

In one or more embodiments, the dielectric material may include, for example, a compound represented by Formula 2:

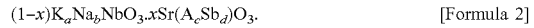
$(1-x)K_aNa_bNbO_3 \cdot xSr(A_cSb_d)O_3$. [Formula 2]

wherein, in Formula 2, A may be at least one of B, Al, Ga, In, Tl, Sc, Y, La, Ce, Pr, Nd, Sm, Eu, Gd, Tb, Dy Ho, Er, Tm, Yb, and Lu, 0<x<1, 0<a<1, 0<b<1, 0<c<1, 0<d<1, a+b=1, and c+d=1.

In Formula 2, for example, x may be 0.01 to 0.3, and/or 0.05 to 0.2.

The compound represented by Formula 1 may be, for example, a compound represented by at least one of Formula 3, Formula 4, Formula 5, and/or Formula 6:

$(1-x)K_aNa_bNbO_3 \cdot xSr(B_cSb_d)O_3$ [Formula 3]

wherein, in Formula 3, 0<x<1, 0<a<1, 0<b<1, 0<c<1, 0<d<1, a+b=1, and c+d=1;

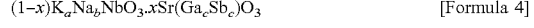
$(1-x)K_aNa_bNbO_3 \cdot xSr(Ga_cSb_c)O_3$ [Formula 4]

wherein, in Formula 4, 0<x<1, 0<a<1, 0<b<1, 0<c<1, 0<d<1, a+b=1, and c+d=1;

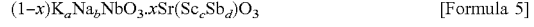
$(1-x)K_aNa_bNbO_3 \cdot xSr(Sc_cSb_d)O_3$ [Formula 5]

wherein, in Formula 5, 0<x<1, 0<a<1, 0<b<1, 0<c<1, 0<d<1, a+b=1, and c+d=1; and

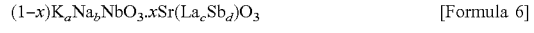
$(1-x)K_aNa_bNbO_3 \cdot xSr(La_cSb_d)O_3$ [Formula 6]

wherein, in Formula 6, 0<x<1, 0<a<1, 0<b<1, 0<c<1, 0<d<1, a+b=1, and c+d=1.

For example, in Formulae 3 to 6, x may be 0.01 to 0.3, for example, 0.05 to 0.2.

As measured by X-ray diffraction analysis, the compound of Formula 1 may exhibit a main peak as a broad singlet form in a diffraction angle (2θ) region of 45° to 47°. The singlet peak may have a half width at half maximum (HWHM) of 0.475 to 0.507, for example, 0.5.

The compound of Formula 1 may include, for example, at least one of $(1-x)(K_aNa_b)NbO_3 \cdot xSr(Ga_cSb_d)O_3$, $(1-x)(K_aNa_b)NbO_3 \cdot xSr(Sc_cSb_d)O_3$, $(1-x)(K_aNa_b)NbO_3 \cdot xSr(La_cSb_d)O_3$, $(1-x)(K_aNa_b)NbO_3 \cdot xSr(B_cSb_d)O_3$, $(1-x)(K_aNa_b)NbO_3 \cdot xSr(Al_cSb_d)O_3$, $(1-x)(K_aNa_b)NbO_3 \cdot xSr(In_cSb_d)O_3$, $(1-x)(K_aNa_b)NbO_3 \cdot xSr(Y_cSb_d)O_3$, $(1-x)(K_aNa_b)NbO_3 \cdot xSr(Ce_cSb_d)O_3$, $(1-x)(K_aNa_b)NbO_3 \cdot xSr(Nd_cSb_d)O_3$, $(1-x)(K_aNa_b)NbO_3 \cdot xSr(Gd_cSb_d)O_3$, $(1-x)(K_aNa_b)NbO_3 \cdot xSr(Sm_cSb_d)O_3$, $(1-x)(K_aNa_b)NbO_3 \cdot xSr(Eu_cSb_d)O_3$, $(1-x)(K_aNa_b)NbO_3 \cdot xSr(Tb_cSb_d)O_3$, $(1-x)(K_aNa_b)NbO_3 \cdot xCa(Ga_cSb_d)O_3$, $(1-x)(K_aNa_b)NbO_3 \cdot xCa(Sc_cSb_d)O_3$, $(1-x)(K_aNa_b)NbO_3 \cdot xCa(La_cSb_d)O_3$, $(1-x)(K_aNa_b)NbO_3 \cdot xCa(B_cSb_d)O_3$, $(1-x)(K_aNa_b)NbO_3 \cdot xCa(Al_cSb_d)O_3$, $(1-x)(K_aNa_b)NbO_3 \cdot xCa(In_cSb_d)O_3$, $(1-x)(K_aNa_b)NbO_3 \cdot xCa(Y_cSb_d)O_3$, $(1-x)(K_aNa_b)NbO_3 \cdot xCa(Ce_cSb_d)O_3$, $(1-x)(K_aNa_b)NbO_3 \cdot xCa(Nd_cSb_d)O_3$, $(1-x)(K_aNa_b)NbO_3 \cdot xCa(Gd_cSb_d)O_3$, $(1-x)(K_aNa_b)NbO_3 \cdot xCa(Sm_cSb_d)O_3$, $(1-x)(K_aNa_b)NbO_3 \cdot xCa(Eu_cSb_d)O_3$, $(1-x)(K_aNa_b)NbO_3 \cdot xCa(Tb_cSb_d)O_3$, $(1-x)(K_aNa_b)NbO_3 \cdot xBa(Ga_cSb_d)O_3$, $(1-x)(K_aNa_b)NbO_3 \cdot xBa(Sc_cSb_d)O_3$, $(1-x)(K_aNa_b)NbO_3 \cdot xBa(La_cSb_d)O_3$, $(1-x)(K_aNa_b)NbO_3 \cdot xBa(B_cSb_d)O_3$, $(1-x)(K_aNa_b)NbO_3 \cdot xBa(Al_cSb_d)O_3$, $(1-x)(K_aNa_b)NbO_3 \cdot xBa(In_cSb_d)O_3$, $(1-x)(K_aNa_b)NbO_3 \cdot xBa(Y_cSb_d)O_3$, $(1-x)$ $(K_aNa_b)NbO_3.xBa(Ce_cSb_d)O_3$, $(1-x)(K_aNa_b)NbO_3.xBa(Nd_cSb_d)O_3$, $(1-x)(K_aNa_b)NbO_3.xBa(Gd_cSb_d)O_3$, $(1-x)(K_aNa_b)NbO_3.xBa(Sm_cSb_d)O_3$, $(1-x)(K_aNa_b)NbO_3.xBa(Eu_cSb_d)O_3$, and/or $(1-x)(K_aNa_b)NbO_3.xBa(Tb_cSb_d)O_3$.

In the formulae, for example, x may be 0.01 to 0.3, a and b may each independently be 0.4 to 0.6, and c and d may each independently be 0.4 to 0.6. Here, the sum of a and b may be 1, and the sum of c and d may be 1.

In one or more embodiments, the compound of Formula 1 may be at least one of $(1-x)(K_{0.5}Na_{0.5})NbO_3.xSr(Ga_{0.5}Sb_{0.5})O_3$, $(1-x)(K_{0.5}Na_{0.5})NbO_3.xSr(Sc_{0.5}Sb_{0.5})O_3$, $(1-x)(K_{0.5}Na_{0.5})NbO_3.xSr(La_{0.5}Sb_{0.5})O_3$, $(1-x)(K_{0.5}Na_{0.5})NbO_3.xSr(B_{0.5}Sb_{0.5})O_3$, $(1-x)(K_{0.5}Na_{0.5})NbO_3.xSr(Al_{0.5}Sb_{0.5})O_3$, $(1-x)(K_{0.5}Na_{0.5})NbO_3.xSr(In_{0.5}Sb_{0.5})O_3$, $(1-x)(K_{0.5}Na_{0.5})NbO_3.xSr(Y_{0.5}Sb_{0.5})O_3$, $(1-x)(K_{0.5}Na_{0.5})NbO_3.xSr(Ce_{0.5}Sb_{0.5})O_3$, $(1-x)(K_{0.5}Na_{0.5})NbO_3.xSr(Nd_{0.5}Sb_{0.5})O_3$, $(1-x)(K_{0.5}Na_{0.5})NbO_3.xSr(Gd_{0.5}Sb_{0.5})O_3$, $(1-x)(K_{0.5}Na_{0.5})NbO_3.xSr(Sm_{0.5}Sb_{0.5})O_3$, $(1-x)(K_{0.5}Na_{0.5})NbO_3.xSr(Eu_{0.5}Sb_{0.5})O_3$, $(1-x)(K_{0.5}Na_{0.5})NbO_3.xSr(Tb_{0.5}Sb_{0.5})O_3$ $(1-x)(K_{0.5}Na_{0.5})NbO_3.xCa(Ga_{0.5}Sb_{0.5})O_3$, $(1-x)(K_{0.5}Na_{0.5})NbO_3.xCa(Sc_{0.5}Sb_{0.5})O_3$, $(1-x)(K_{0.5}Na_{0.5})NbO_3.xCa(La_{0.5}Sb_{0.5})O_3$, $(1-x)(K_{0.5}Na_{0.5})NbO_3.xCa(B_{0.5}Sb_{0.5})O_3$, $(1-x)(K_{0.5}Na_{0.5})NbO_3.xCa(Al_{0.5}Sb_{0.5})O_3$, $(1-x)(K_{0.5}Na_{0.5})NbO_3.xCa(In_{0.5}Sb_{0.5})O_3$, $(1-x)(K_{0.5}Na_{0.5})NbO_3.xCa(Y_{0.5}Sb_{0.5})O_3$, $(1-x)(K_{0.5}Na_{0.5})NbO_3.xCa(Ce_{0.5}Sb_{0.5})O_3$, $(1-x)(K_{0.5}Na_{0.5})NbO_3.xCa(Nd_{0.5}Sb_{0.5})O_3$, $(1-x)(K_{0.5}Na_{0.5})NbO_3.xCa(Gd_{0.5}Sb_{0.5})O_3$, $(1-x)(K_{0.5}Na_{0.5})NbO_3.xCa(Sm_{0.5}Sb_{0.5})O_3$, $(1-x)(K_{0.5}Na_{0.5})NbO_3.xCa(Eu_{0.5}Sb_{0.5})O_3$, $(1-x)(K_{0.5}Na_{0.5})NbO_3.xCa(Tb_{0.5}Sb_{0.5})O_3$, $(1-x)(K_{0.5}Na_{0.5})NbO_3.xBa(Ga_{0.5}Sb_{0.5})O_3$, $(1-x)(K_{0.5}Na_{0.5})NbO_3.xBa(Sc_{0.5}Sb_{0.5})O_3$, $(1-x)(K_{0.5}Na_{0.5})NbO_3.xBa(La_{0.5}Sb_{0.5})O_3$, $(1-x)(K_{0.5}Na_{0.5})NbO_3.xBa(B_{0.5}Sb_{0.5})O_3$, $(1-x)(K_{0.5}Na_{0.5})NbO_3.xBa(Al_{0.5}Sb_{0.5})O_3$, $(1-x)(K_{0.5}Na_{0.5})NbO_3.xBa(In_{0.5}Sb_{0.5})O_3$, $(1-x)(K_{0.5}Na_{0.5})NbO_3.xBa(Y_{0.5}Sb_{0.5})O_3$, $(1-x)(K_{0.5}Na_{0.5})NbO_3.xBa(Ce_{0.5}Sb_{0.5})O_3$, $(1-x)(K_{0.5}Na_{0.5})NbO_3.xBa(Nd_{0.5}Sb_{0.5})O_3$, $(1-x)(K_{0.5}Na_{0.5})NbO_3.xBa(Gd_{0.5}Sb_{0.5})O_3$, $(1-x)(K_{0.5}Na_{0.5})NbO_3.xBa(Sm_{0.5}Sb_{0.5})O_3$, $(1-x)(K_{0.5}Na_{0.5})NbO_3.xBa(Eu_{0.5}Sb_{0.5})O_3$, and/or $(1-x)(K_{0.5}Na_{0.5})NbO_3.xBa(Tb_{0.5}Sb_{0.5})O_3$, wherein, in the above formulae, x may be 0.01 to 0.3.

The dielectric material including the compound represented by Formula 1 may have a composite-phase crystal structure including at least one of an orthorhombic, cubic, and/or tetragonal crystal structures. The dielectric material may have, for example, a pseudocubic phase under the condition of a solid solution including an $M(A_cSb_d)O_3$ content of 5 mol % or greater. The pseudocubic phase may refer to a cubic phase-like crystal structure. For example, the pseudocubic phase may include a rhombohedral crystalline structure simulating, but including a lower symmetry to, a cubic phase. Therefore, the structural characteristics, as an aggregate of the above-described composite phases, may appear as a pseudocubic phase.

An electric field-polarization plot for the dielectric material including the compound of Formula 1 may appear as a linear curve proportional to an applied electric field, in which a maximum polarization (Pmax) and a polarization (Pr) of the dielectric material decrease as the content of $M(A_cSb_d)O_3$ increases.

In comparison, a common KNN may exhibit a typical ferroelectric hysteresis loop, while the electric field-polarization plot of the dielectric material, as a solid solution, according to one or more embodiments may appear as a linear curve as the content of $M(A_cSb_d)O_3$ is increased.

The dielectric material according to one or more embodiments may have a permittivity of 610 or greater at room temperature (25° C.) and at 1 kHz to 1 MHz, whereby a capacitor including the dielectric material may have improved dielectric properties, and it may become easier to manufacture a smaller, thinner, higher-capacity capacitor. The dielectric material according to one or more embodiments may have a permittivity of 800 or greater, 900 or greater, for example, 900 to 100,000, 1,000 to 30,000, 1,000 to 10,000, 1,050 to 5,000, and/or 1,100 to 1,900.

According to another aspect, a device may include a plurality of electrodes; and a dielectric material layer between the plurality of electrodes, wherein the dielectric material layer includes the dielectric material according to one or more example embodiments.

The device may be, for example a capacitor. The capacitor may include a plurality of internal electrodes, and a dielectric material layer alternately disposed between the plurality of internal electrodes.

The dielectric material layer may have a specific resistance of 1.0E+9 Ωcm or greater, for example, 1.0E+11 Ωcm or greater, and/or, 1.2 to 4 E+11 Ωcm. As above, the dielectric material layer may have good insulating characteristics.

By including the dielectric material according to the above-described embodiments, the device according to one or more embodiments may have improved dielectric characteristics, and consequentially have improved electric characteristics.

The device may be used for an electric circuit, an electronic circuit, an electromagnetic circuit, and/or the like, and is not particularly limited as long as the device provides an electrical output for an electrical input. The electrical input may be current and/or voltage, and the current may be direct current and/or alternating current. The electrical input may be a continuous input and/or intermittent input with a constant cycle. For example, the device may store electrical energy, electrical signals, magnetic energy, and/or magnetic signals. The device may be a semiconductor device, a memory, a processor, and/or the like. The device may include, for example, a resistor, an inductor, a capacitor, and/or the like.

The device may be, for example, a capacitor. The capacitor may be, for example, a multi-layer capacitor including a plurality of internal electrodes; and the above-described dielectric material layer alternately disposed between the plurality of internal electrodes. The capacitor may have an independent device form, such as a multi-layer capacitor, but is not necessarily limited to such a form, and may be included as part of a memory. The capacitor may be, for example, a metal insulator metal (MIM) capacitor mounted in a memory device.

Figure 6:
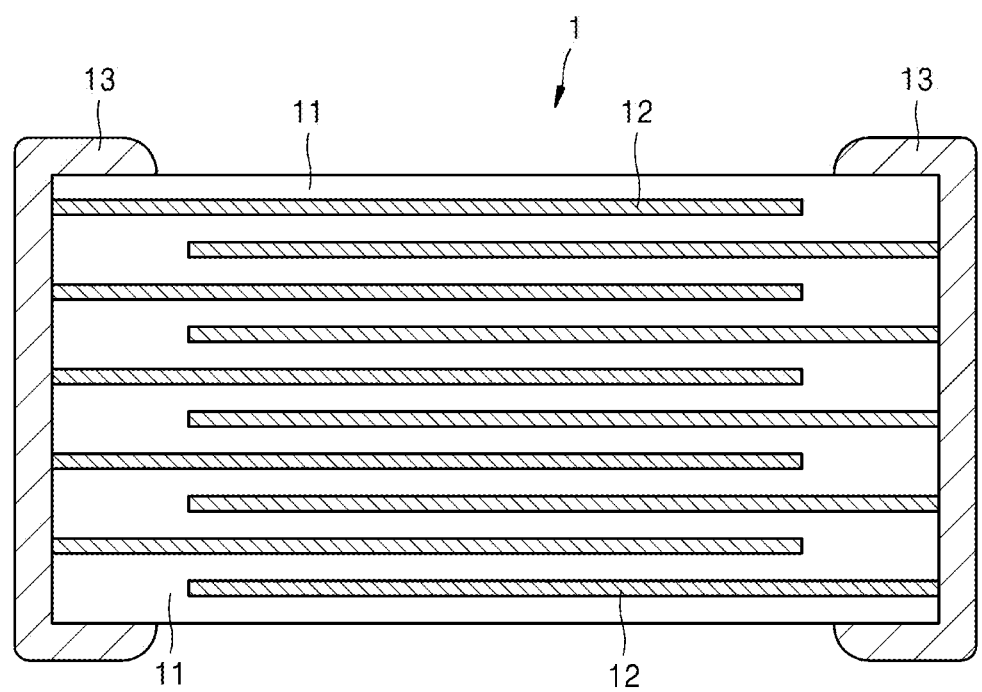
FIG. 6 is a schematic view of a multi-layered ceramic capacitor (MLCC) according to an example embodiment.

Referring to FIG. 6, a multi-layer capacitor 1 according to an embodiment may include a plurality of internal electrodes 12, and a dielectric material layer 11 alternately disposed between the plurality of internal electrodes 12. The multi-layer capacitor 1 may have a structure in which the plurality of internal electrodes 12 and the dielectric material layer 11 are alternately stacked, and the dielectric material layer 11 may include the dielectric material according to one or more embodiments. The adjacent internal electrodes 12 may be electrically separated from one another by the dielectric material layer 11 therebetween. In the multi-layer capacitor 1, as the internal electrodes 12 and the dielectric material layer 11 are alternately stacked, the dielectric material layer 11 between the adjacent internal electrodes 12 may act as a single unit capacitor. In the multi-layer capacitor 1, the number of the internal electrodes 12 and the number of the dielectric material layers 11, which are alternately stacked, may each independently be, for example, 2 or greater, 5 or greater, 10 or greater, 20 or greater, 50 or greater, 100 or greater, 200 or greater, 500 or greater, 1,000 or greater, 2,000 or greater, 5,000 or greater, and/or 10,000 or greater. The multi-layer capacitor 1 may provide capacitance through the stacked structure in which a plurality of unit capacitors are stacked. As the number of the stacked internal electrodes 12 and the dielectric material layer 11 increases, a contact area thereof may increase, thus improving the capacitance. The internal electrodes 12 may be disposed to have an area smaller than the area of the dielectric material layer 11. The plurality of the internal electrodes 12 may each have an identical area, however, the adjacent internal electrodes 12 may be disposed not to be in the same position along the thickness direction of the multi-layer capacitor 1, and to partially protrude alternately in the directions of the opposing side surfaces of the multi-layer capacitor 1.

The internal electrodes 12 may be formed, for example, by placing conductive plates between the dielectric material layers and/or using a conductive paste including a conductive material, for example at least one of nickel (Ni), copper (Cu), palladium (Pd), a palladium-silver (Pd—Ag) alloy, and/or the like. A printing method may be used to deposit the conductive paste. For example, the printing method may be a screen printing method and/or a gravure printing method, but is not necessarily limited thereto, and any method of forming internal electrodes, the method being used in the art, may be used. The internal electrodes 12 may have a thickness of, for example, 100 nm to 5 µm, 100 nm to 2.5 µm, 100 nm to 1 µm, 100 nm to 800 nm, 100 nm to 400 nm, and/or 100 nm to 200 nm.

Referring to FIG. 6, a plurality of the internal electrodes 12, which are alternately stacked to partially protrude from opposing side surfaces of the multi-layered capacitor 1, may be electrically connected to external electrodes 13. The external electrodes 13 may be, for example, on a laminate structure including the dielectric material layer 11 alternately disposed between the plurality of the internal electrodes 12, and connected to the internal electrodes 12. The multi-layer capacitor 1 may include the internal electrodes 12, and external electrodes 13 respectively connected to the internal electrodes 12. The multi-layer capacitor 1 may include, for example, a pair of external electrodes 13 surrounding the opposite sides of a laminate structure including the internal electrodes 12 and the dielectric material layer 11. The external electrodes 13 may be any material having electrical conductivity, such as metal, or may be a specific material, which may be determined considering electrical characteristics, structural stability, and the like. The external electrodes 13 may have, for example, a multi-layer structure. The external electrodes 13 may include, for example, an electrode layer contacting the laminate and the internal electrodes 12 and comprising Ni and a plating layer on the electrode layer.

Referring to FIG. 6, the dielectric material layers 11 in the multi-layer capacitor 1 may, for example, have a larger cross-sectional area than the cross-sectional area of the adjacent internal electrodes 12. The dielectric material layer 11 between the adjacent internal electrodes 12 in the multi-layer capacitor 1 may be connected to each other. The dielectric material layer 11 between the adjacent internal electrodes 12 may be connected to one another at the sides of the multi-layer capacitor 1, and may be in contact with the external electrodes 13 in the multi-layer capacitor 1. In some example embodiments, the external electrodes 13 may be omitted. When the external electrodes 13 are omitted, the internal electrodes 12 protruding to the opposing sides of the multi-layer capacitor 1 may be connected to a power source.

In a unit capacitor including the adjacent internal electrodes 12 and the dielectric material layers 11 disposed therebetween, a thickness of the dielectric material layer 11 (e.g., a gap between the adjacent internal electrodes 12) may be, for example, 10 nm to 1 µm, 100 nm to 800 nm, 100 nm to 600 nm, and/or 100 nm to 300 nm. In a unit capacitor including the adjacent internal electrodes 12 and the dielectric material layers 11 therebetween, a permittivity of the dielectric material layer 11 may be, for example, 610 or greater at room temperature (25° C.) in a range of 1 kHz to 1 MHz.

By the inclusion of the dielectric material layer 11 having such a small thickness and high permittivity, the multi-layer capacitor 1 may have improved capacitance and have reduced thickness and volume. Accordingly, a smaller, thinner capacitor with higher capacity may be provided.

The dielectric material and/or the multi-layer capacitor 1 including the dielectric material may be, for example, included in a semiconductor apparatus D70. The semiconductor apparatus D70 may have memory characteristics and may be, for example, DRAM.

Figure 7A:
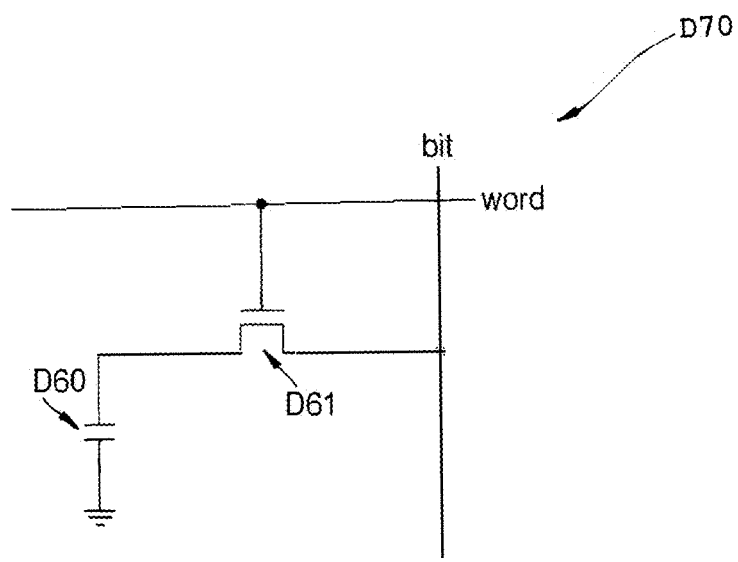
FIG. 7A illustrates a circuit configuration of a memory cell of a memory device including a semiconductor device and a capacitor.
Figure 7B:
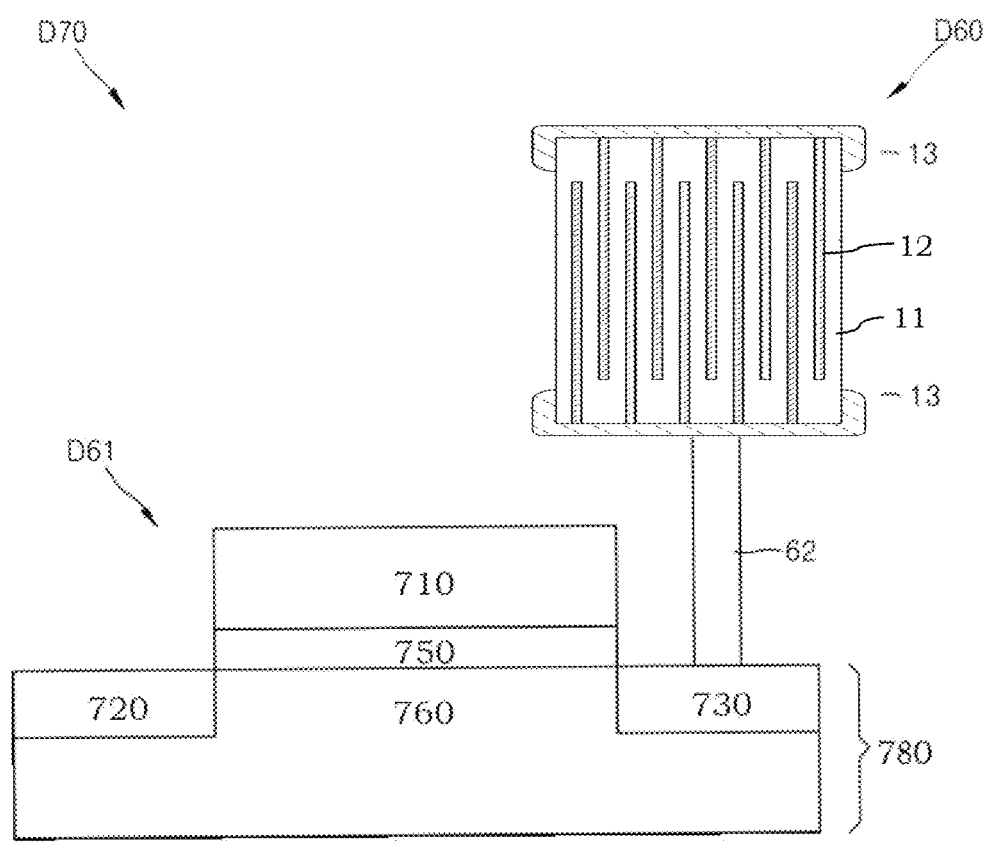
FIG. 7B is a schematic diagram showing a semiconductor apparatus according to an example embodiment.

FIG. 7A illustrates a circuit configuration of a memory cell of a memory device including a semiconductor device and a capacitor. FIG. 7B is a schematic diagram showing a semiconductor apparatus according to an example embodiment.

Referring to FIG. 7A, the semiconductor apparatus D70 may be included in a memory device as a memory cell and may include a transistor D61 and a capacitor D60 electrically connected to, for example, a source region 730 of the transistor D61. The memory device may include a plurality of bit lines and a plurality of word lines, and may further include a plurality of the memory cells. Each word line may be electrically connected to a gate electrode 710 of the transistor D61, and each bit line may be electrically connected to a drain region 720 of the transistor D61. An electrode of the capacitor D60 may be connected to, for example, a voltage controller (not shown). For example, referring to FIG. 7B, a semiconductor apparatus D70 may include a capacitor D60 including a relaxer-ferroelectric material 200, and a field effect transistor D61 electrically connected to the capacitor D60 by a contact 62. The capacitor D60 may be, for example the multi-layer capacitor 1 of FIG. 6. One of the outer electrodes 13 of the capacitor D60 and one of the source region 730 and the drain region 720 of the transistor D61 may be electrically connected by a contact 62. The contact 62 may include a conductive material, such as tungsten, copper, aluminum, polysilicon, and the like.

The field effect transistor D61 may include a substrate 780 including a source region 730, a drain region 720, and a channel 760, and a gate electrode 710 facing the channel 760. A dielectric layer 750 may be between the substrate 780 and the gate electrode 710. The field effect transistor D61 of FIG. 7B shows an example that does not include the relaxer-ferroelectric material 200, but the field effect transistor may also include the relaxer-ferroelectric material 200.

Hereinafter, a method of preparing the dielectric material according to one or more example embodiments will be described.

In order to prepare a dielectric material including the compound of Formula 1, first, a mixture of potassium salt, sodium salt, Nb compound, M-containing compound, A compound, and Sb compound may be mechanically milled.

Subsequently, the milled product may be subjected to a first heat treatment under an oxidizing atmosphere.

$$(1-x)K_aNa_bNbO_3 \cdot xM(A_cSb_d)O_3 \quad \text{[Formula 1]}$$

As above, in Formula 1, M may be a Group 2 element, A may be a trivalent element, $0<x<1$, $0<a<1$, $0<b<1$, $0<c<1$, $0<d<1$, $a+b=1$, and $c+d=1$.

The potassium salt may be, for example, potassium carbonate, potassium sulfate, potassium nitrate ($K_2NO_3$), or a combination thereof, and the sodium salt may be, for example, sodium carbonate, sodium sulfate, or a combination thereof. The Nb compound may be, for example, niobium oxide. The M-containing compound may be, for example, strontium carbonate, strontium sulfate, calcium carbonate, barium carbonate, magnesium carbonate, magnesium sulfate, calcium sulfate, barium sulfate, strontium oxide, magnesium oxide, or a combination thereof.

The A compound may be, for example, boron oxide, aluminum (Al) oxide, gallium (Ga) oxide, indium (In) oxide, thallium (Tl) oxide, scandium (Sc) oxide, yttrium (Y) oxide, lanthanum (La) oxide, cerium (Ce) oxide, praseodymium (Pr) oxide, neodymium (Nd) oxide, samarium (Sm) oxide, europium (Eu) oxide, gadolinium (Gd) oxide, terbium (Tb) oxide, dysprosium (Dy) oxide, or a combination thereof. The antimony (Sb) compound may be, for example, antimony oxide.

The amounts of the above-described potassium salt, sodium salt, Nb compound, M-containing compound, A compound, and Sb compound may be stoichiometrically controlled to obtain the compound of Formula 1.

In the preparation method according to one or more embodiments, the mechanical milling may be ball-milling, airjet-milling, bead milling, roll-milling, planetary milling, hand milling, high-energy ball milling, planetary ball milling, stirred ball milling, vibrating milling, mechanofusion milling, shaker milling, attritor milling, disk milling, shape milling, conical screw milling (e.g., with a Nauta-type mixer), precision mixing (e.g., with a Nobilta mixer), high-speed mixing, and/or a combination thereof. The mechanical milling may be, for example, wet milling using a solvent. When the mechanical milling is performed according to wet milling as described above, a dielectric material with improved permittivity characteristics may be prepared.

In the wet milling using a solvent, ethanol may be used as the solvent. Although the mechanical milling time varies depending on the milling conditions, the mechanical milling time may be, for example, 1 to 30 hours, for example, 5 to 25 hours.

The first heat treatment may be performed at a temperature of 800° C. to 1000° C., for example, 850° C. to 950° C. The first heat treatment may be carried out under an oxidizing atmosphere. The first heat treatment may be performed, for example, for 1 to 30 hours, and/or 2 to 15 hours. By performing the heat treatment under an oxidizing atmosphere in such time periods, the dielectric material may have further improved dielectric characteristics.

After the first heat treatment, a molded product may be obtained using a product from the first heat treatment, for example, the molded product may be produced by applying uniaxial pressure to the product of the first heat treatment. The molded product may, then, be subjected to a second heat treatment under an oxidizing atmosphere.

The second heat treatment may be carried out at a temperature of 1100° C. to 1300° C., for example, 1150° C. to 1250° C. When the second heat treatment is carried out under an oxidizing atmosphere, the second heat treatment may be carried out, for example, for 1 to 30 hours, and/or 3 to 25 hours. By the further inclusion of the second heat treatment under such conditions, it may be possible to effectively prevent defects of the dielectric material.

The first heat treatment and/or second heat treatment under an oxidizing atmosphere may be carried out under an atmosphere including oxygen, carbon dioxide, air, or the like. In an atmosphere containing oxygen, carbon dioxide, air, or the like, the amount of oxygen, carbon dioxide, air, or the like may be, for example, 0.1 to 10% by volume, 0.1 to 5% by volume, 0.1 to 3% by volume, and/or 0.5 to 2% by volume of the total gas volume. The remainder gas, excluding oxygen, carbon dioxide, air, or the like, may be an inert gas. The inert gas may be argon, nitrogen, or the like, but is not limited thereto, and may be any inert gas used in the art. For example, an oxidizing gas containing oxygen, carbon dioxide, air, or the like may be mixed with an inert gas to create the oxidizing atmosphere.

As used herein, the "oxidizing atmosphere" may also be, for example, an ambient air atmosphere.

The dielectric material according to one or more example embodiments prepared according to the above-described processes may be a high-dielectric material including pseudocubic and polar nanoregion (PNR) formations, which can be used for multi-layered ceramic capacitors (MLCCs) in the trend of miniaturization and high-performance. In addition, the dielectric material may be dense with a relative density of 98% or greater.

The dielectric material according to one or more embodiments may be applicable as a multilayer dielectric for a piezoelectric actuator, a multilayer dielectric for an antenna, and/or a dielectric of a nonvolatile memory device. The dielectric material may be implemented in an electronic device, for example as a MLCC in mobile phones, televisions, and/or vehicles.

One or more embodiments of the present disclosure will now be described in detail with reference to the following examples and comparative examples.

Preparation of Dielectric Material

Example 1

$K_2CO_3$, $Na_2CO_3$, $Nb_2O_5$, $SrCO_3$, $Ga_2O_3$, and $Sb_2O_3$ were mixed to obtain a mixture, and ethanol and zirconia balls were added thereto. Subsequently, the resultant mixture was ball-milled for 24 hours in an air atmosphere at room temperature to prepare the mixture. The prepared mixture was dried at 100° C. for 1 day to obtain dry powder. Here, the amounts of $K_2CO_3$, $Na_2CO_3$, $Nb_2O_5$, $SrCO_3$, $Ga_2O_3$, and $Sb_2O_3$ were controlled to be stoichiometric to obtain a dielectric material as showing in Table 1.

The dry powder was put into an alumina crucible, and then subjected to a first heat treatment at 950° C. in an air atmosphere for 12 hours.

The first heat treatment product was pressed with uniaxial pressure to prepare pellets. The prepared pellets were heat-treated at 1250° C. for 24 hours in an air atmosphere to prepare a dielectric material having the composition shown in Table 1 below.

Example 2

A dielectric material was prepared in the same manner as in Example 1, except that $Sc_2O_3$ was used instead of $Ga_2O_3$.

Example 3

A dielectric material was prepared in the same manner as in Example 1, except that $La_2O_3$ was used instead of $Ga_2O_3$.

Example 4

A dielectric material was obtained in the same manner as in Example 1, except that the amounts of $K_2CO_3$, $Na_2CO_3$, $Nb_2O_5$, $SrCO_3$, $Ga_2O_3$, and $Sb_2O_3$ were stoichiometrically controlled to obtain a dielectric material as shown in Table 1.

Example 5

A dielectric material was prepared in the same manner as in Example 1, except that $Sc_2O_3$ was used instead of $Ga_2O_3$, and the amounts of $K_2CO_3$, $Na_2CO_3$, $Nb_2O_5$, $SrCO_3$, $Sc_2O_3$, and $Sb_2O_3$ were controlled to be stoichiometric to obtain a dielectric material as shown in Table 1.

Example 6

A dielectric material was prepared in the same manner as in Example 1, except that $La_2O_3$ was used instead of $Ga_2O_3$, and the amounts of $K_2CO_3$, $Na_2CO_3$, $Nb_2O_5$, $SrCO_3$, $La_2O_3$, and $Sb_2O_3$ were controlled to be stoichiometric to obtain a dielectric material as shown in Table 1.

Examples 7-8

Dielectric materials were obtained in the same manner as in Example 1, except that the amounts of $K_2CO_3$, $Na_2CO_3$, $Nb_2O_5$, $SrCO_3$, $Ga_2O_3$, and $Sb_2O_3$ were controlled to be stoichiometric to obtain dielectric materials as shown in Table 1.

Examples 9-10

Dielectric materials were prepared in the same manner as in Example 1, except that $Sc_2O_3$ was used instead of $Ga_2O_3$, and the amounts of $K_2CO_3$, $Na_2CO_3$, $Nb_2O_5$, $SrCO_3$, $Sc_2O_3$, and $Sb_2O_3$ were controlled to be stoichiometric to obtain dielectric materials as shown in Table 1.

Examples 11-12

Dielectric materials were prepared in the same manner as in Example 1, except that $La_2O_3$ was used instead of $Ga_2O_3$, and the amounts of $K_2CO_3$, $Na_2CO_3$, $Nb_2O_5$, $SrCO_3$, $La_2O_3$, and $Sb_2O_3$ were controlled to be stoichiometric to obtain dielectric materials as shown in Table 1.

Comparative Example 1

A dielectric material $(K_{0.5}Na_{0.5})NbO_3$ (KNN) was prepared in the same manner as in Example 1, except that $SrCO_3$, $Ga_2O_3$, and $Sb_2O_3$ were not added.

TABLE 1

| Example | Composition of dielectric material |
|---|---|
| Example 1 | $0.925K_{0.5}Na_{0.5}Nb_{0.5}O_3 \cdot\cdot 0.075Sr(Ga_{0.5}Sb_{0.5})O_3$ |
| Example 2 | $0.925K_{0.5}Na_{0.5}Nb_{0.5}O_3 \cdot 0.075Sr(Sc_{0.5}Sb_{0.5})O_3$ |
| Example 3 | $0.925K_{0.5}Na_{0.5}Nb_{0.5}O_3 \cdot 0.075Sr(La_{0.5}Sb_{0.5})O_3$ |
| Example 4 | $0.9K_{0.5}Na_{0.5}Nb_{0.5}O_3 \cdot 0.1Sr(Ga_{0.5}Sb_{0.5})O_3$ |
| Example 5 | $0.9K_{0.5}Na_{0.5}Nb_{0.5}O_3 \cdot 0.1Sr(Sc_{0.5}Sb_{0.5})O_3$ |

TABLE 1-continued

| Example | Composition of dielectric material |
|---|---|
| Example 6 | $0.9K_{0.5}Na_{0.5}Nb_{0.5}O_3 \cdot 0.1Sr(La_{0.5}Sb_{0.5})O_3$ |
| Example 7 | $0.99K_{0.5}Na_{0.5}Nb_{0.5}O_3 \cdot 0.01Sr(Ga_{0.5}Sb_{0.5})O_3$ |
| Example 8 | $0.7K_{0.5}Na_{0.5}Nb_{0.5}O_3 \cdot 0.3Sr(Ga_{0.5}Sb_{0.5})O_3$ |
| Example 9 | $0.99K_{0.5}Na_{0.5}Nb_{0.5}O_3 \cdot 0.01Sr(Sc_{0.5}Sb_{0.5})O_3$ |
| Example 10 | $0.7K_{0.5}Na_{0.5}Nb_{0.5}O_3 \cdot 0.3Sr(Sc_{0.5}Sb_{0.5})O_3$ |
| Example 11 | $0.99K_{0.5}Na_{0.5}Nb_{0.5}O_3 \cdot 0.01Sr(La_{0.5}Sb_{0.5})O_3$ |
| Example 12 | $0.7K_{0.5}Na_{0.5}Nb_{0.5}O_3 \cdot 0.3Sr(La_{0.5}Sb_{0.5})O_3$ |
| Comparative Example 1 | $K_{0.5}Na_{0.5}Nb_{0.5}O_3$ |

Evaluation Example 1: X-Ray Diffraction Experiment

Figure 3A:
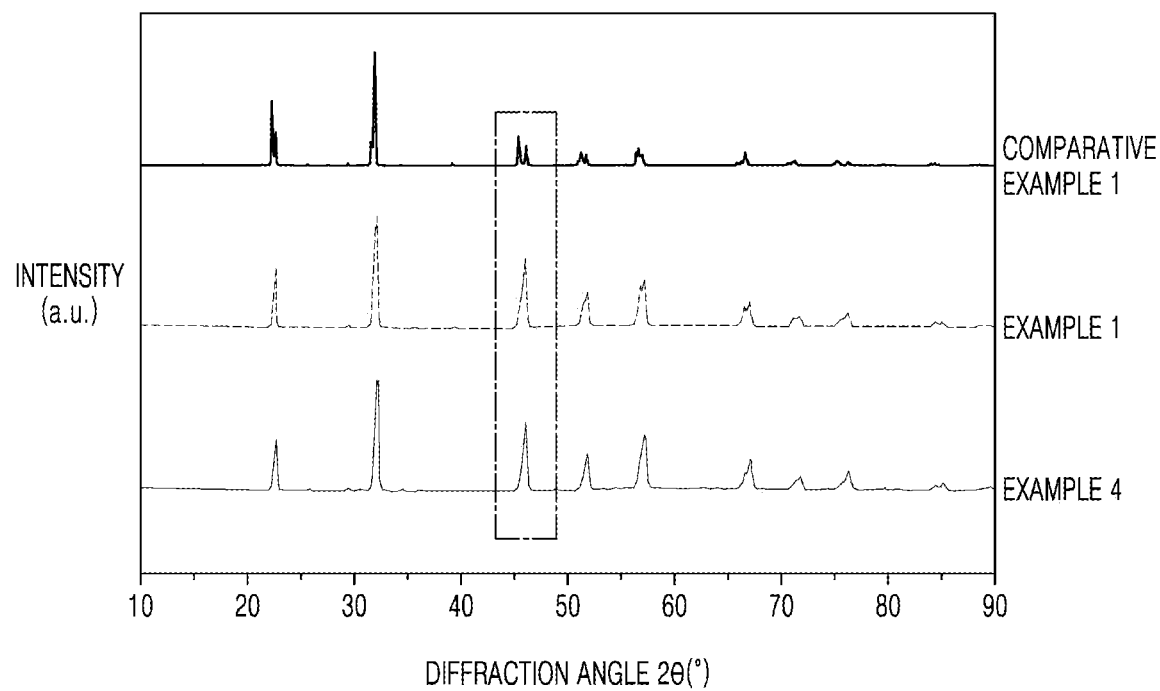
FIGS. 3A and 3B illustrate X-ray diffraction analysis results of dielectric materials of Example 1, Example 4, and Comparative Example 1.
Figure 3B:
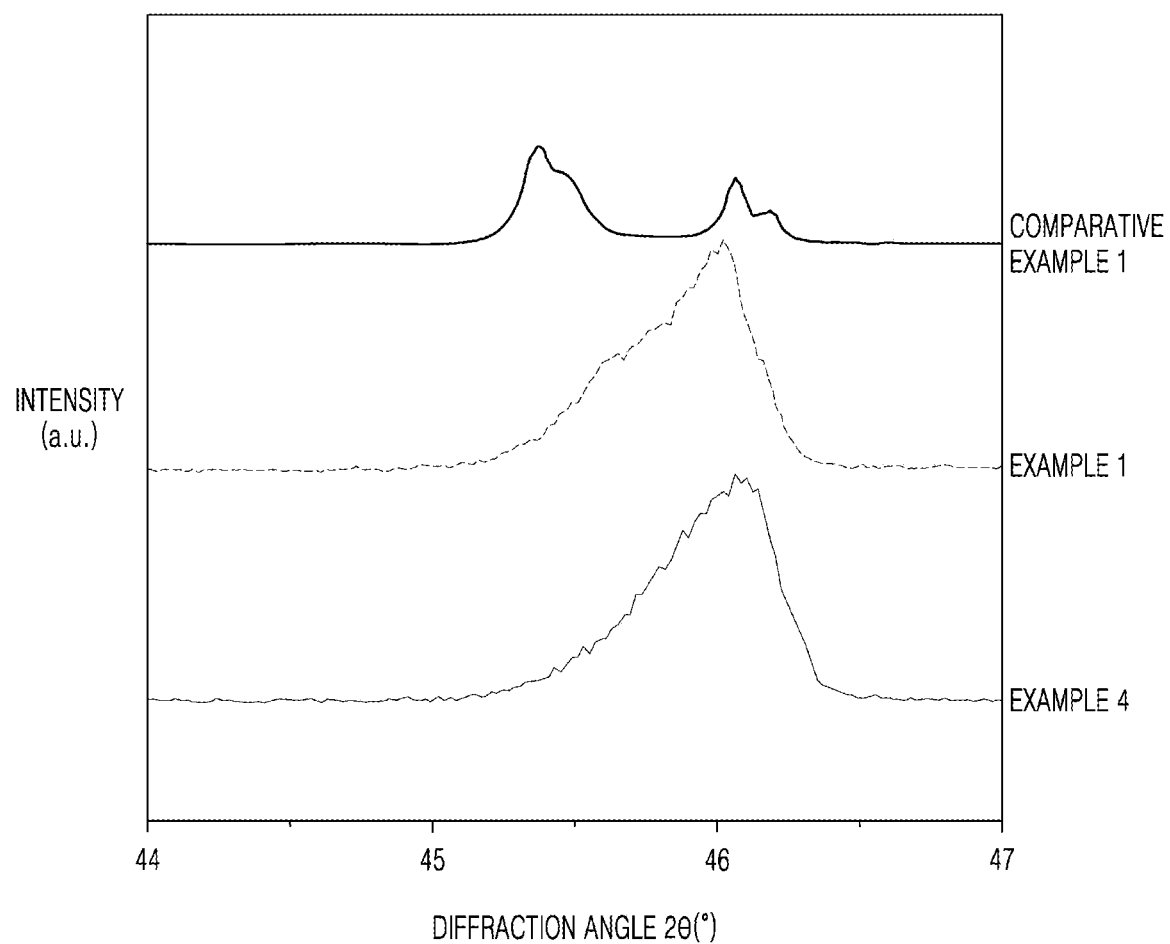

Powder X-ray diffraction (XRD) spectra of the dielectric materials of Comparative Example 1, Example 1, and Example 4 were measured with CuKα radiation. Powder obtained by grinding pellets of each dielectric material was used, and a Bruker D8 Advance was used in the XRD analysis. The measurement results are shown in FIG. 3A. FIG. 3B is a magnified view of the rectangular region of FIG. 3A, which is a region at 2θ of 44 to 47°.

As shown in FIG. 3A, the dielectric materials of Examples 1 and 4 have substantially the same peak positions compared to the dielectric material of Comparative Example 1.

As shown, the dielectric materials of Examples 1 and 4 exhibit a main peak including a broad singlet in a region of diffraction angles (2θ) of 45 to 47°. From these results, it was found that the dielectric materials of Examples 1 and 4 have a composite phase crystal structure, e.g., a pseudocubic phase crystal structure including at least one selected from orthorhombic and cubic phases.

In comparison, the dielectric material of Comparative Example 1 showed peaks related to the (022) plane and the (200) plane in the region of 2θ of 44 to 47°, as seen in FIG. 3B, indicating that the dielectric material has an orthorhombic crystal structure. In addition, the dielectric material of Comparative Example 1 showed a peak at a different location from that of the dielectric materials of Examples 1 and 4, and a different peak shape. From these results, it was found that the dielectric materials of Examples 1 and 4 included a phase having a crystal structure different from that of the dielectric material of Comparative Example 1.

Evaluation Example 2: Temperature Characteristics of Permittivity

Silver (Ag) electrodes were coated on the opposite surfaces of the pellets of the dielectric materials prepared in Example 1, Example 4, and Comparative Example 1 to prepare specimens. A permittivity of each specimen was measured using a LCR meter (Agilent, E4980A) at 25° C. and a condition of 1 kHz/1.0V. The permittivity was measured in a temperature-controlled chamber at temperatures from −55° C. to 200° C. at 5° C. intervals with reference to X7S of the EIA specification, and some of the results are shown in FIG. 4.

Figure 4:
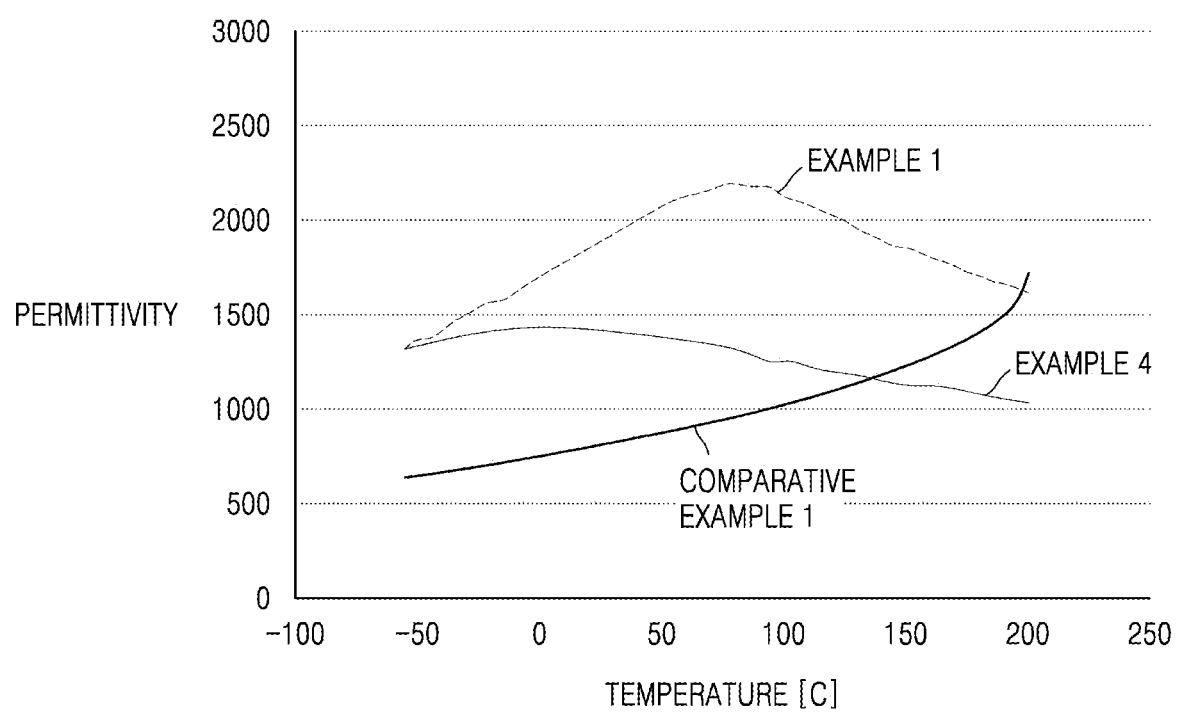
FIG. 4 illustrates changes in permittivity according to temperature in the dielectric materials of Example 1, Example 4, and Comparative Example 1.

Referring to FIG. 4, though not illustrated, the dielectric material of Comparative Example 1 had a cubic transition temperature of 400° C., and exhibited the maximum permittivity at this temperature. As used herein, the "cubic transition temperature" refers to the temperature at which the dielectric material of Comparative Example 1, which has an orthorhombic crystalline structure at room temperature, changes into a cubic phase.

However, the dielectric materials of Example 1 and Example 4 exhibited maximum permittivity at 80° C. and 0° C., respectively. This indicates that the dielectric materials of Examples 1 and 4 have stable temperature characteristics of permittivity, and became pseudo-cubic at room temperature (25° C.).

To determine the temperature characteristic of permittivity, e.g., the temperature coefficient of capacitance (TCC), capacitance was measured at temperatures from −55° C. to 200° C. at 5° C. intervals in a temperature-controlled chamber with reference to X7S of the EIA specification, and some of the results are shown in Table 2.

The temperature characteristic of permittivity is represented by Equation 1. The temperature characteristics of permittivity are obtained by measurement of capacitance according to temperature.

$$TCC\ (\%) = [(\text{Capacitance at } 125°\text{ C.} - \text{Capacitance at } 25°\text{ C.})/\text{Capacitance at } 25°\text{ C.}] \times 100 \qquad \text{<Equation 1>}$$

TABLE 2

| Example | Composition | TCC (%) |
|---|---|---|
| Example 1 | 0.925KNN•0.075SGS | 5 |
| Example 4 | 0.9KNN•0.1SGS | −16 |
| Comparative Example 1 | KNN | 37 |

As shown in Table 2, the dielectric materials of Examples 1 and 4 exhibited a change in capacitance of −16% to 5% in the temperature range of 25° C. to 125° C.

Accordingly, the dielectric materials of Example 1 and Example 4 exhibited stable temperature characteristic of permittivity.

In comparison, the dielectric material of Comparative Example 1 exhibited poor temperature characteristics of permittivity.

Evaluation Example 3: Measurement of Specific Resistance and Dielectric Characteristics The density, specific resistance, and dielectric characteristics of the dielectric materials of Examples 1-6 and Comparative Example 1 were evaluated according to the following methods.

(1) Specific Resistance

Using a Premier II Ferroelectric Tester (Radiant Technologies, Inc.), specific resistance was measured for 1 second after stabilization for 60 seconds under the condition of applying a DC high-electric field of 8.7 V/μm.

(2) Nominal Permittivity

Silver (Ag) was coated on opposite surfaces of the dielectric pellets to form opposing electrodes, and then permittivity was measured at room temperature using an E4980A Precision LCR Meter (Keysight) at an AC of 1V and a frequency of 100 Hz, 1 kHz or 100 MHz.

(3) Permittivity Reduction Rate (Effective Dielectric Constant: $\varepsilon_{dc}$)

Permittivity reduction rates (e.g., effective dielectric constants ($\varepsilon_{dc}$)), were evaluated using a Premier II Ferroelectric Tester (Radiant Technologies, Inc.), under the condition of applying a DC electric field (0 V/μm or 8.7 V/μm), with an AC electric field (87 mV/μm) at a frequency of 100 Hz. The effective dielectric constant is represented by Equation 2.

$$\Delta\varepsilon/\varepsilon_0 = (\varepsilon - \varepsilon_0)/\varepsilon_0 \qquad \text{[Equation 2]}$$

In Equation 2, ε denotes permittivity at dc=8.7 V/μm, (e.g., the effective permittivity), and Co denotes permittivity at dc=0 V/μm.

The evaluation results of the specific resistance, nominal permittivity, and effective dielectric constant are shown in Table 3. The density of Table 3 is the relative density and was measured by using the buoyancy method (e.g., Archimedes method).

TABLE 3

| Composition | Density | Specific resistance (Ωcm) @8.7 V/um | Nominal permittivity (1 V) | | | | | | $\varepsilon_{dc}$(@100 Hz, AC = 87 mV/um) | | |
|---|---|---|---|---|---|---|---|---|---|---|---|
| | | | 100 Hz | | 1 kHz | | 1 MHz | | $\varepsilon_0$ | ε | |
| | | | ε | tanδ | ε | tanδ | ε | tanδ | (@dc = 0 V/μm) | (@dc = 8.7 V/μm) | $\Delta\varepsilon/\varepsilon_0$ |
| Comparative Example 1 KNN | 99% | 3.71·E+05 | 608 | 0.03 | 579 | 0.04 | 465 | 0.06 | 867 | 350 | −60% |
| Example 1 0.925KNN•0.075SGS | 100% | 1.33·E+11 | 1854 | 0.03 | 1786 | 0.03 | 1540 | 0.05 | 1984 | 905 | −54% |
| Example 2 0.925KNN•0.075SSS | 100% | 3.64·E+11 | 1720 | 0.02 | 1662 | 0.02 | 1468 | 0.04 | 1861 | 849 | −54% |
| Example 3 0.925KNN•0.075SLS | 99% | 1.39·E+11 | 1747 | 0.03 | 1689 | 0.02 | 1535 | 0.03 | 1897 | 1005 | −47% |
| Example 4 0.9KNN•0.1SGS | 98% | 1.74·E+09 | 1353 | 0.03 | 1309 | 0.02 | 1194 | 0.03 | 1331 | 821 | −38% |
| Example 5 0.9KNN•0.1SSS | 100% | 3.20·E+11 | 1481 | 0.02 | 1436 | 0.02 | 1276 | 0.04 | 1652 | 835 | −49% |
| Example 6 0.9KNN•0.1SLS | 98% | — | 1045 | 0.14 | 889 | 0.09 | — | — | 1206 | 738 | −39% |

In Table 3, ε denotes permittivity, and tan δ denotes loss factor.

As shown in Table 3, the dielectric materials of Examples 1 to 3 had a nominal permittivity of 1,700 or greater, indicating greatly improved permittivity, compared to the dielectric material of Comparative Example 1 having a nominal permittivity of 608. The specific resistances of the dielectric materials of Examples 1 to 6 under the condition where a high-electric field of 8.7 V/μm was applied were higher compared to that of Comparative Example 1.

The dielectric material of Comparative Example 1 exhibited a permittivity reduction rate (effective dielectric constant: $\varepsilon_{dc}$) of 350, while those of Examples 1 to exhibited greatly increased permittivities, indicating improved permittivity characteristics.

According to one or more example embodiments, provided is a device having improved permittivity characteristics by the inclusion of the dielectric material according to one or more embodiments having improved structural stability and physical properties. The dielectric material effectively operates in a high-electric field region, and thus a device with high efficiency in accordance with thinning of the dielectric material layer may be manufactured.

Figure 5:
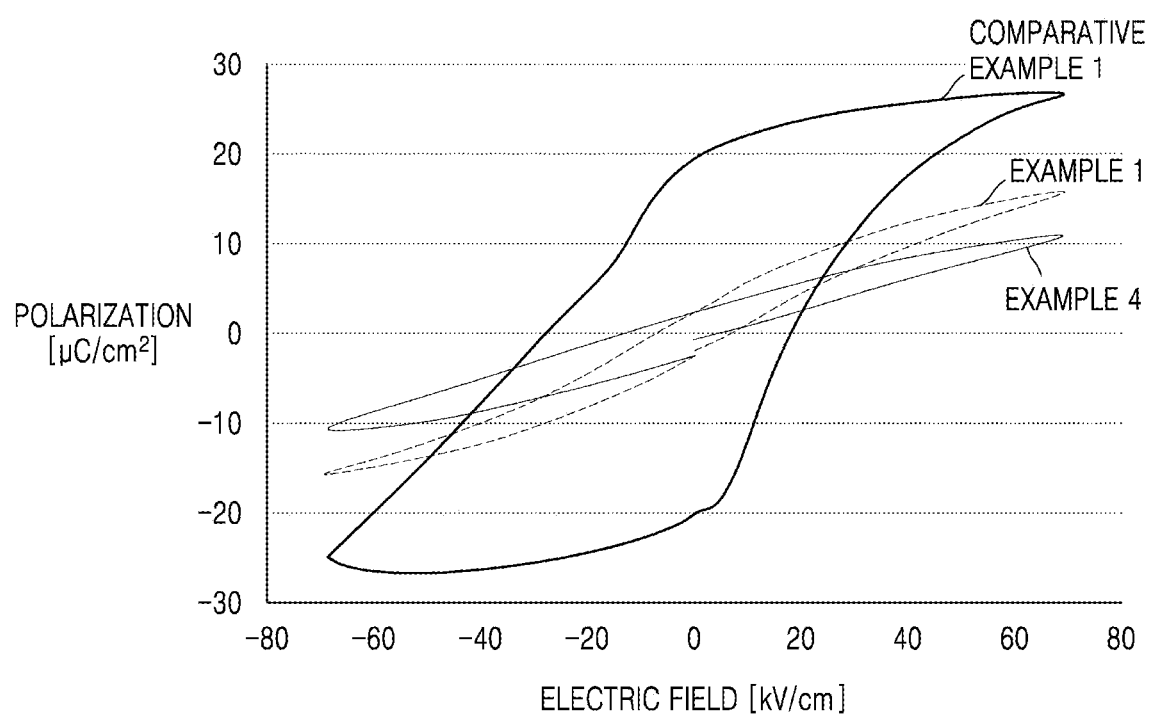
FIG. 5 illustrates changes in polarization according to electric field in the dielectric materials of Example 1, Example 4, and Comparative Example 1.

FIG. 5 illustrates changes in polarization according to electric field in the dielectric materials of Example 1, Example 4, and Comparative Example 1;

Referring to FIG. 5, the dielectric materials of Comparative Example 1 exhibits a change in polarization of ferroelectric, and the dielectric materials of Example 4 exhibits a change in polarization of phase dielectric.

The dielectric material of Example 1 has an increased content of KNN compared to the dielectric material of Example 4. It can be seen that as the content of KNN increases, the structure of the dielectric material changes from the orthorhombic structure (ferroelectric) of KNN to the pseudo-cubic structure (phase dielectric).

It should be understood that the example embodiments described herein should be considered in a descriptive sense only and not for purposes of limitation. Descriptions of features and/or aspects within each embodiment should typically be considered as available for other similar features and/or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A dielectric material comprising a compound represented by Formula 1:

$$(1-x)K_aNa_bNbO_3 \cdot xM(A_cSb_d)O_3 \quad \text{[Formula 1]}$$

wherein, in Formula 1, K is potassium, Na is sodium, Nb is niobium, Sb is antimony, O is oxygen, M is a Group 2 element, A is a trivalent element, and $0<x<1$, $0<a<1$, $0<b<1$, $0<c<1$, $0<d<1$, $a+b=1$, and $c+d=1$.

2. The dielectric material of claim 1, wherein M is strontium (Sr), calcium (Ca), barium (Ba), magnesium (Mg), or a combination thereof.

3. The dielectric material of claim 1, wherein A is boron (B), aluminum (Al), gallium (Ga), indium (In), thallium (Tl), scandium (Sc), yttrium (Y), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), lutetium (Lu), or a combination thereof.

4. The dielectric material of claim 1, wherein, in Formula 1, x is 0.01 to 0.3.

5. The dielectric material of claim 1, wherein, in Formula 1, x is 0.05 to 0.2.

6. The dielectric material of claim 1, wherein the compound represented by Formula 1 is a compound represented by Formula 2:

$$(1-x)K_aNa_bNbO_3 \cdot xSr(A_cSb_d)O_3 \quad \text{[Formula 2]}$$

wherein, in Formula 2, A is boron (B), aluminum (Al), gallium (Ga), indium (In), thallium (Tl), scandium (Sc), yttrium (Y), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), lutetium (Lu), or a combination thereof.

7. The dielectric material of claim 6, wherein, in Formula 2, x is 0.01 to 0.3.

8. The dielectric material of claim 1, wherein the compound represented by Formula 1 is a compound represented by Formula 3:

$$(1-x)K_aNa_bNbO_3 \cdot xSr(B_cSb_d)O_3. \quad \text{[Formula 3]}$$

9. The dielectric material of claim 1, wherein the compound represented by Formula 1 is a compound represented by Formula 4:

$$(1-x)K_aNa_bNbO_3 \cdot xSr(Ga_cSb_d)O_3. \quad \text{[Formula 4]}$$

10. The dielectric material of claim 1, wherein the compound represented by Formula 1 is a compound represented by Formula 5:

$$(1-x)K_aNa_bNbO_3 \cdot xSr(Sc_cSb_d)O_3. \quad \text{[Formula 5]}$$

11. The dielectric material of claim 1, wherein the compound represented by Formula 1 is a compound represented by Formula 6:

$$(1-x)K_aNa_bNbO_3 \cdot xSr(La_cSb_d)O_3. \quad \text{[Formula 6]}$$

12. The dielectric material of claim 1, wherein the compound represented by Formula 1 exhibits a main peak including a singlet form in a diffraction angle (2θ) region of 45° to 47°, as obtained by an X-ray diffraction analysis.

13. The dielectric material of claim 1, wherein the compound represented by Formula 1 includes a composite-phase crystalline structure including one or more selected from among orthorhombic, cubic, and tetragonal crystalline structures.

14. The dielectric material of claim 13, wherein the composite-phase crystalline structure includes a pseudo-cubic crystalline structure.

15. The dielectric material of claim 1, wherein an electric field-polarization plot for the compound represented by Formula 1 appears as a linear curve proportional to electric field, in which a maximum polarization (Pmax) and a polarization (Pr) are decrease as x increases.

16. The dielectric material of claim 1, wherein the compound represented by Formula 1 is at least one of $(1-x)(K_aNa_b)NbO_3 \cdot xSr(Ga_cSb_d)O_3$, $(1-x)(K_aNa_b)NbO_3 \cdot xSr(Sc_cSb_d)O_3$, $(1-x)(K_aNa_b)NbO_3 \cdot xSr(La_cSb_d)O_3$, $(1-x)(K_aNa_b)NbO_3 \cdot xSr(B_cSb_d)O_3$, $(1-x)(K_aNa_b)NbO_3 \cdot xSr(Al_cSb_d)O_3$, $(1-x)(K_aNa_b)NbO_3 \cdot xSr(In_cSb_d)O_3$, $(1-x)(K_aNa_b)NbO_3 \cdot xSr(Y_cSb_d)O_3$, $(1-x)(K_aNa_b)NbO_3 \cdot xSr(Ce_cSb_d)O_3$, $(1-x)(K_aNa_b)NbO_3 \cdot xSr(Nd_cSb_d)O_3$, $(1-x)(K_aNa_b)NbO_3 \cdot xSr(Gd_cSb_d)O_3$, $(1-x)(K_aNa_b)NbO_3 \cdot xSr(Sm_cSb_d)O_3$, $(1-x)(K_aNa_b)NbO_3 \cdot xSr(Eu_cSb_d)O_3$, $(1-x)(K_aNa_b)NbO_3 \cdot xSr(Tb_cSb_d)O_3$, $(1-x)(K_aNa_b)NbO_3 \cdot xCa(Ga_cSb_d)O_3$, $(1-x)(K_aNa_b)NbO_3 \cdot xCa(Sc_cSb_d)O_3$, $(1-x)(K_aNa_b)NbO_3 \cdot xCa(La_cSb_d)O_3$, $(1-x)(K_aNa_b)NbO_3 \cdot xCa$ $(B_cSb_d)O_3$, $(1-x)(K_aNa_b)NbO_3.xCa(Al_cSb_d)O_3$, $(1-x)(K_aNa_b)NbO_3.xCa(In_cSb_d)O_3$, $(1-x)(K_aNa_b)NbO_3.xCa(Y_cSb_d)O_3$, $(1-x)(K_aNa_b)NbO_3.xCa(Ce_cSb_d)O_3$, $(1-x)(K_aNa_b)NbO_3.xCa(Nd_cSb_d)O_3$, $(1-x)(K_aNa_b)NbO_3.xCa(Gd_cSb_d)O_3$, $(1-x)(K_aNa_b)NbO_3.xCa(Sm_cSb_d)O_3$, $(1-x)(K_aNa_b)NbO_3.xCa(Eu_cSb_d)O_3$, $(1-x)(K_aNa_b)NbO_3.xCa(Tb_cSb_d)O_3$, $(1-x)(K_aNa_b)NbO_3.xBa(Ga_cSb_d)O_3$, $(1-x)(K_aNa_b)NbO_3.xBa(Sc_cSb_d)O_3$, $(1-x)(K_aNa_b)NbO_3.xBa(La_cSb_d)O_3$, $(1-x)(K_aNa_b)NbO_3.xBa(B_cSb_d)O_3$, $(1-x)(K_aNa_b)NbO_3.xBa(Al_cSb_d)O_3$, $(1-x)(K_aNa_b)NbO_3.xBa(In_cSb_d)O_3$, $(1-x)(K_aNa_b)NbO_3.xBa(Y_cSb_d)O_3$, $(1-x)(K_aNa_b)NbO_3.xBa(Ce_cSb_d)O_3$, $(1-x)(K_aNa_b)NbO_3.xBa(Nd_cSb_d)O_3$, $(1-x)(K_aNa_b)NbO_3.xBa(Gd_cSb_d)O_3$, $(1-x)(K_aNa_b)NbO_3.xBa(Sm_cSb_d)O_3$, $(1-x)(K_aNa_b)NbO_3.xBa(Eu_cSb_d)O_3$, and $(1-x)(K_aNa_b)NbO_3.xBa(Tb_cSb_d)O_3$, wherein, in the formulae, x is 0.01 to 0.3, a and b are each independently 0.4 to 0.6, c and d are each independently 0.4 to 0.6, the sum of a and b is 1, and the sum of c and d is 1.

17. The dielectric material of claim 1, wherein the compound represented by Formula 1 is at least one of $(1-x)(K_{0.5}Na_{0.5})NbO_3.xSr(Ga_{0.5}Sb_{0.5})O_3$, $(1-x)(K_{0.5}Na_{0.5})NbO_3.xSr(Sc_{0.5}Sb_{0.5})O_3$, $(1-x)(K_{0.5}Na_{0.5})NbO_3.xSr(La_{0.5}Sb_{0.5})O_3$, $(1-x)(K_{0.5}Na_{0.5})NbO_3.xSr(B_{0.5}Sb_{0.5})O_3$, $(1-x)(K_{0.5}Na_{0.5})NbO_3.xSr(Al_{0.5}Sb_{0.5})O_3$, $(1-x)(K_{0.5}Na_{0.5})NbO_3.xSr(In_{0.5}Sb_{0.5})O_3$, $(1-x)(K_{0.5}Na_{0.5})NbO_3.xSr(Y_{0.5}Sb_{0.5})O_3$, $(1-x)(K_{0.5}Na_{0.5})NbO_3.xSr(Ce_{0.5}Sb_{0.5})O_3$, $(1-x)(K_{0.5}Na_{0.5})NbO_3.xSr(Nd_{0.5}Sb_{0.5})O_3$, $(1-x)(K_{0.5}Na_{0.5})NbO_3.xSr(Gd_{0.5}Sb_{0.5})O_3$, $(1-x)(K_{0.5}Na_{0.5})NbO_3.xSr(Sm_{0.5}Sb_{0.5})O_3$, $(1-x)(K_{0.5}Na_{0.5})NbO_3.xSr(Eu_{0.5}Sb_{0.5})O_3$, $(1-x)(K_{0.5}Na_{0.5})NbO_3.xSr(Tb_{0.5}Sb_{0.5})O_3$ $(1-x)(K_{0.5}Na_{0.5})NbO_3.xCa(Ga_{0.5}Sb_{0.5})O_3$, $(1-x)(K_{0.5}Na_{0.5})NbO_3.xCa(Sc_{0.5}Sb_{0.5})O_3$, $(1-x)(K_{0.5}Na_{0.5})NbO_3.xCa(La_{0.5}Sb_{0.5})O_3$, $(1-x)(K_{0.5}Na_{0.5})NbO_3.xCa(B_{0.5}Sb_{0.5})O_3$, $(1-x)(K_{0.5}Na_{0.5})NbO_3.xCa(Al_{0.5}Sb_{0.5})O_3$, $(1-x)(K_{0.5}Na_{0.5})NbO_3.xCa(In_{0.5}Sb_{0.5})O_3$, $(1-x)(K_{0.5}Na_{0.5})NbO_3.xCa(Y_{0.5}Sb_{0.5})O_3$, $(1-x)(K_{0.5}Na_{0.5})NbO_3.xCa(Ce_{0.5}Sb_{0.5})O_3$, $(1-x)(K_{0.5}Na_{0.5})NbO_3.xCa(Nd_{0.5}Sb_{0.5})O_3$, $(1-x)(K_{0.5}Na_{0.5})NbO_3.xCa(Gd_{0.5}Sb_{0.5})O_3$, $(1-x)(K_{0.5}Na_{0.5})NbO_3.xCa(Sm_{0.5}Sb_{0.5})O_3$, $(1-x)(K_{0.5}Na_{0.5})NbO_3.xCa(Eu_{0.5}Sb_{0.5})O_3$, $(1-x)(K_{0.5}Na_{0.5})NbO_3.xCa(Tb_{0.5}Sb_{0.5})O_3$, $(1-x)(K_{0.5}Na_{0.5})NbO_3.xBa(Ga_{0.5}Sb_{0.5})O_3$, $(1-x)(K_{0.5}Na_{0.5})NbO_3.xBa(Sc_{0.5}Sb_{0.5})O_3$, $(1-x)(K_{0.5}Na_{0.5})NbO_3.xBa(La_{0.5}Sb_{0.5})O_3$, $(1-x)(K_{0.5}Na_{0.5})NbO_3.xBa(B_{0.5}Sb_{0.5})O_3$, $(1-x)(K_{0.5}Na_{0.5})NbO_3.xBa(Al_{0.5}Sb_{0.5})O_3$, $(1-x)(K_{0.5}Na_{0.5})NbO_3.xBa(In_{0.5}Sb_{0.5})O_3$, $(1-x)(K_{0.5}Na_{0.5})NbO_3.xBa(Y_{0.5}Sb_{0.5})O_3$, $(1-x)(K_{0.5}Na_{0.5})NbO_3.xBa(Ce_{0.5}Sb_{0.5})O_3$, $(1-x)(K_{0.5}Na_{0.5})NbO_3.xBa(Nd_{0.5}Sb_{0.5})O_3$, $(1-x)(K_{0.5}Na_{0.5})NbO_3.xBa(Gd_{0.5}Sb_{0.5})O_3$, $(1-x)(K_{0.5}Na_{0.5})NbO_3.xBa(Sm_{0.5}Sb_{0.5})O_3$, $(1-x)(K_{0.5}Na_{0.5})NbO_3.xBa(Eu_{0.5}Sb_{0.5})O_3$, and $(1-x)(K_{0.5}Na_{0.5})NbO_3.xBa(Tb_{0.5}Sb_{0.5})O_3$, wherein, x is 0.01 to 0.3.

18. The dielectric material of claim 1, wherein the compound represented by Formula 1 has a permittivity of 610 or greater at 1 kHz to 1 MHz.

19. The dielectric material of claim 1, wherein, in the compound represented by Formula 1, $(1-x)K_aNa_bNbO_3$ and $xM(A_cSb_d)O_3$ form a solid solution.

20. The dielectric material of claim 1, wherein the dielectric material includes
a ferroelectric material exhibiting a first polarization characteristic; and
a polar region within the ferroelectric material, the polar region exhibiting a second polarization characteristic.

21. The dielectric material of claim 20, wherein the ferroelectric material includes $K_aNa_bNbO_3$, and
the polar region includes $M(A_cSb_d)O_3$.

22. The dielectric material of claim 20, wherein, in response to an alternating current sweep, the polar region has a lower energy barrier than the ferroelectric material.

23. A device comprising:
a plurality of electrodes; and
a dielectric material layer between the plurality of electrodes,
wherein the dielectric material layer comprises the dielectric material according to claim 1.

24. The device of claim 23, wherein the device is a capacitor.

25. The device of claim 23, wherein the dielectric material layer between the plurality of electrodes has a thickness of 1000 nm or less.

26. The device of claim 23, wherein the device is a multi-layer capacitor comprising: a plurality of internal electrodes; and a dielectric material layers alternately disposed between the plurality of internal electrodes.

27. The device of claim 23, wherein the dielectric material layer has a permittivity of 610 or greater at 1 kHz to 1 MHz.

28. The device of claim 23, wherein the dielectric material layer has a specific resistance of 1.0 E+9 Ωcm or greater.

29. A memory cell comprising:
a transistor; and
a capacitor,
wherein at least one of the transistor and the capacitor includes the device of claim 23.

30. A method of preparing a dielectric material, the method comprising:
mechanically milling a mixture of potassium (K) salt, sodium (Na) salt, a niobium (Nb) compound, an M-containing compound, an A compound, and an antimony compound; and
performing first heat treatment under an oxidizing atmosphere,
wherein, the dielectric material comprises a compound represented by Formula 1, $$(1-x)K_aNa_bNbO_3\text{-}xM(A_cSb_d)O_3 \quad \text{[Formula 1]}$$

wherein, in Formula 1, M is a Group 2 element,
A is a trivalent element, and
$0<a<1$, $0<b<1$, $0<c<1$, $0<d<1$, $a+b=1$, and $c+d=1$.

31. The method of claim 30, wherein the first heat treatment is performed at a temperature of 800° C. to 1000° C.

32. The method of claim 30, further comprising, after the first heat treatment is performed under the oxidizing atmosphere:
obtaining a molded body using a product of the first heat treatment; and
performing second heat treatment on the molded body.

33. The method of claim 32, wherein the obtaining the molded body includes applying uniaxial pressure to the product of the first heat treatment.

34. The method of claim 32, wherein the second heat treatment is performed at a temperature of 1,100° C. to 1,300° C.

35. The method of claim 30, wherein the potassium salt is potassium carbonate, potassium sulfate, potassium nitrate, or a combination thereof,
the sodium salt is sodium carbonate, sodium sulfate, or a combination thereof,
the Nb compound is niobium oxide,
the M-containing compound is strontium carbonate, strontium sulfate, calcium carbonate, barium carbonate, magnesium carbonate, magnesium sulfate, calcium sulfate, barium sulfate, strontium oxide, magnesium oxide, or a combination thereof, the A compound is boron oxide, aluminum (Al) oxide, gallium (Ga) oxide, indium (In) oxide, thallium (Tl) oxide, scandium (Sc) oxide, yttrium (Y) oxide, lanthanum (La) oxide, cerium (Ce) oxide, praseodymium (Pr) oxide, neodymium (Nd) oxide, samarium (Sm) oxide, europium (Eu) oxide, gadolinium (Gd) oxide, terbium (Tb) oxide, dysprosium (Dy) oxide, or a combination thereof, and the antimony compound is antimony oxide.

36. The method of claim 30, wherein the mechanical milling is ball-milling, airjet-milling, bead milling, roll-milling, planetary milling, hand milling, high-energy ball milling, planetary mill ball milling, stirred ball milling, vibrating milling, mechanofusion milling, shaker milling, attritor milling, disk milling, shape milling, conical screw milling, precision mixing, high-speed mixing, or a combination thereof.

37. The method of claim 30, wherein the mechanical milling includes wet milling with a solvent.

38. The method of claim 37, wherein the solvent includes ethanol.

39. The method of claim 30, wherein the oxidizing atmosphere includes 0.1 to 10% of oxygen, carbon dioxide, air, or a combination thereof, and a remainder of the oxidizing atmosphere includes an inert gas, or is an air atmosphere.

* * * * *